United States Patent [19]

George

[11] 3,947,830
[45] Mar. 30, 1976

[54] COMPLEMENTARY TRANSITION STRUCTURES FOR MAGNETIC DOMAIN PROPAGATION

[75] Inventor: Peter K. George, Placentia, Calif.

[73] Assignee: Rockwell International Corporation, El Segundo, Calif.

[22] Filed: Mar. 27, 1974

[21] Appl. No.: 455,176

[52] U.S. Cl. ............................................. 340/174 TF
[51] Int. Cl.² ............................................. G11C 11/14
[58] Field of Search ............................... 340/174 TF

[56] References Cited
UNITED STATES PATENTS

| | | | |
|---|---|---|---|
| 3,689,901 | 9/1972 | Bobeck | 340/174 TF |
| 3,701,132 | 10/1972 | Bonyhard et al. | 340/174 TF |
| 3,713,116 | 1/1973 | Bonyhard et al. | 340/174 TF |
| 3,737,882 | 6/1973 | Furuoya | 340/174 TF |
| 3,789,373 | 1/1974 | Bonyhard | 340/174 TF |
| 3,792,452 | 2/1974 | Dixon et al. | 340/174 TF |

*Primary Examiner*—James W. Moffitt
*Attorney, Agent, or Firm*—H. Fredrick Hamann; G. Donald Weber, Jr.; Roland G. Rubalcava

[57] ABSTRACT

Structures of soft magnetic material, such as permalloy, provide transitions between chevron channels and other types of channels which move single wall magnetic domains. The structures facilitate varying the size of the domains, i.e., changing the domains from strip to bubble configurations or vice versa, for transfer between chevron channels and other types of channels.

6 Claims, 9 Drawing Figures

3,947,830

COMPLEMENTARY TRANSITION STRUCTURES FOR MAGNETIC DOMAIN PROPAGATION

The invention herein described was made in the course of, or under, contract No. DAABO7-70-C-0258 with the Army.

CROSS-REFERENCE TO RELATED APPLICATIONS

Reference is made to copending U.S. application Ser. No. 455,177, filed Mar 27, 1974, entitled "Complementary Corner Structures for Magnetic Domain Propagation", to Peter K. George and assigned to the common assignee.

BACKGROUND OF THE INVENTION

1. Field of the Invention

This invention relates to magnetizable overlay structures for controlling the movement of magnetic single wall domains using field access propagation techniques and, more particularly, to chevron-shaped, field access drive structures.

2. Description of the Prior Art

At present, devices that utilize magnetic single wall domains typically use soft magnetic overlay structures for propagation and storage. Examples include the T-bar, T-X and X-bar structures. Currently, the chevron structure is most frequently used only for detection, although it may also be used for storage and has certain advantages in this regard, as discussed below.

Propagation structures that are of a chevron pattern may incorporate redundancy. That is, the individual chevron-shaped elements are formed into columns trasverse to the direction of domain propagation. These chevron columns stretch or expand single wall domains into strip-like form. Because of this redundancy of elements, chevron structures are less sensitive to pattern defects than are structures formed from other patterns (which form single wall domains which more closely approximate a circular cross section and are frequently termed "bubble" domains).

Chevrons are also relatively insensitive to gaps between the chevrons. In addition, strip domains formed by chevrons are less sensitive than are bubble domains to fluctuations in magnetic conditions resulting from defects or other inhomogenities in the garnet materials that frequently are used in magnetic domain devices. Finally, chevrons have relatively high drive fields and therefore are more amenable to high frequency operation than other patterns.

As a result of at least these advantages, chevron structures have excellent potential for use as propagation structures in storage loops. In addition, the chevron structure will undoubtedly continue to be used for such functions as strip detection.

IEEE Trans. Mag., Vol. Mag. 9, No. 3, Sept. 1973, pp. 433–66, entitled "Magnetic Bubble Memory Chip Design", relates to structures for transferring domains between chevron and T-bar propagation structures. However, in order to fully implement chevron structures both to propagate domains and also in connection with strip detection, it is desirable to provide structures that are capable of smoothly and effectively transferring domains from chevron structures to other types of structures, such as T-X and X-bar structures, and vice versa.

SUMMARY OF THE INVENTION

The present invention facilitates the use of soft magnetic, chevron overlay structures for moving single wall domains in sheets of magnetic material in the presence of a cyclically varying magnetic field.

Soft magnetic overlay structures provide concentrated magnetic pole arrangements for transferring single wall domains from chevron field access drive structures to other types of structures, and vice versa, within one period of a cyclically varying magnetic drive field.

DESCRIPTION OF A PREFERRED EMBODIMENT

Figure 1:
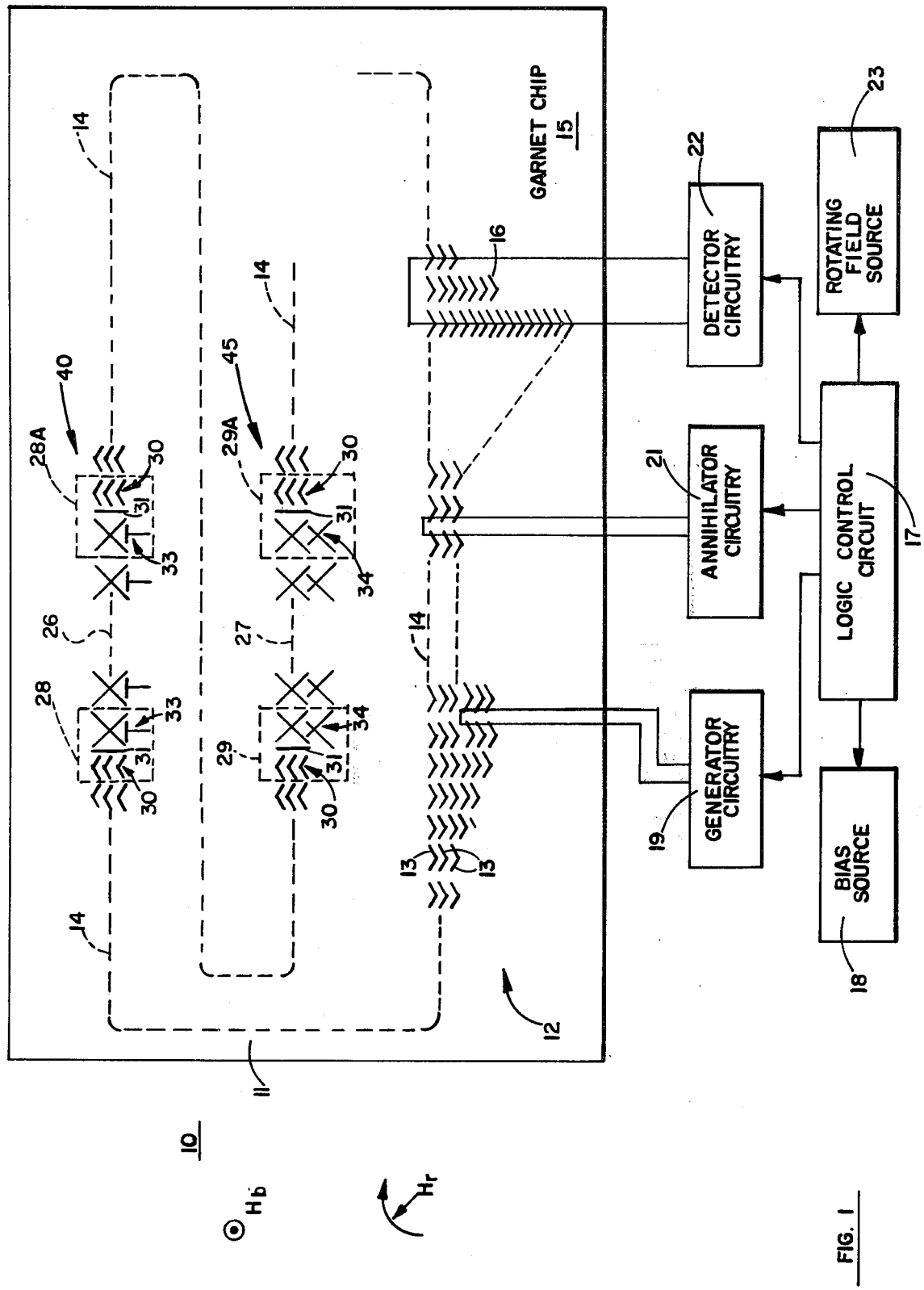
FIG. 1 is a schematic representation of a shift register utilizing single wall magnetic domain transition structures which embody the principles of the present invention.

FIG. 1 shows an exemplary shift register 10 utilizing soft magnetic, single wall domain drive structures which embody the principles of the present invention. The present invention relates to transition structures which transfer single wall magnetic domains between chevron structures for moving domains and other types of structures, such as T-X and X-bar structures.

The shift register 10 may comprise a sheet or layer 11 of material for forming single wall magnetic domains (not shown) in the presence of a perpendicular bias field, $H_b$. Typically, the layer 11 may be in the form of a thin film of magnetic garnet material which is grown on a supporting substrate (not shown), to provide a garnet chip 15. The chip 15 includes a patterned overlay 12 of soft magnetic elements, including chevron elements 13. The chevrons 13 may be used to form channels for effecting movement of the domains. As used here, the word "channels" includes propagation channels such as channel 14 and expansion pattern 16, which facilitates detection of the domains.

The single wall domains may be formed by several methods which are well known in the art. Illustratively, the domains may be generated by pulsing a current in the appropriate direction over one or more chevron elements 13 in the presence of the bias field $H_b$. In a manner well known in the art, a logic control circuit 17 controls the operation of a bias source 18 and generator circuitry 19 for supplying, respectively, the bias field $H_b$ and the current pulses. The logic control circuit 17 also controls domain annihilator circuitry 21 and domain detection circuitry 22. A rotating magnetic field, $H_r$, is effected in the plane of the layer 11 by a rotating field source 23 under the control of logic control circuit 17 to move the domains along the various portions of the overlay 12 of patterned elements.

Referring further to FIG. 1, in addition to the chevron channels 14, the overlay 12 comprises T-X and X-bar channels 26 and 27, respectively. The overlay 12 also comprises transition structures 28 and 29 which interconnect chevron channels to the T-X and X-bar channels, respectively. Transition structures 28A and 29A are located at ends of the T-X channel 26 and the X-bar channel 27, respectively, which are opposite the ends occupied by the structures 28 and 29. The transition structures 28A and 29A are mirror images of, and provide transitions that are the reverse of those provided by, the structures 28 and 29. As a result, a domain can move from a chevron channel, such as the channel 14, to a T-X structure 26 or an X-bar structure 27, then back to a chevron channel.

Figures 2A, 2B, 2C, 2D:
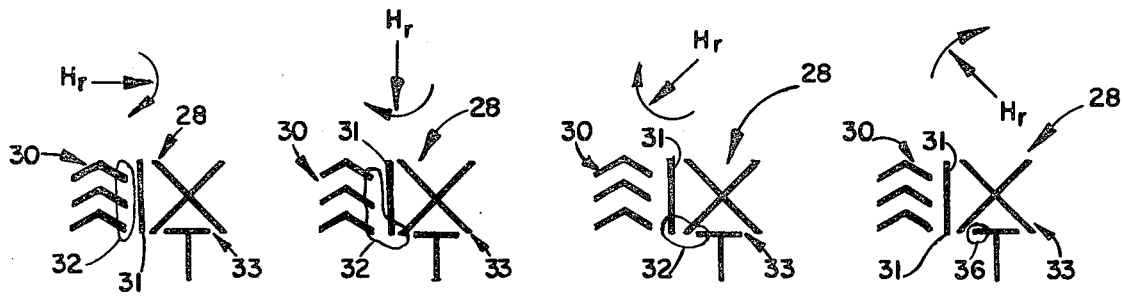
FIGS. 2a–d and 3a–d are schematic representations, in chronological order, illustrating the configuration and path of single wall domains traversing transition structures shown in FIG. 1.
Figures 3A, 3B, 3C, 3D:
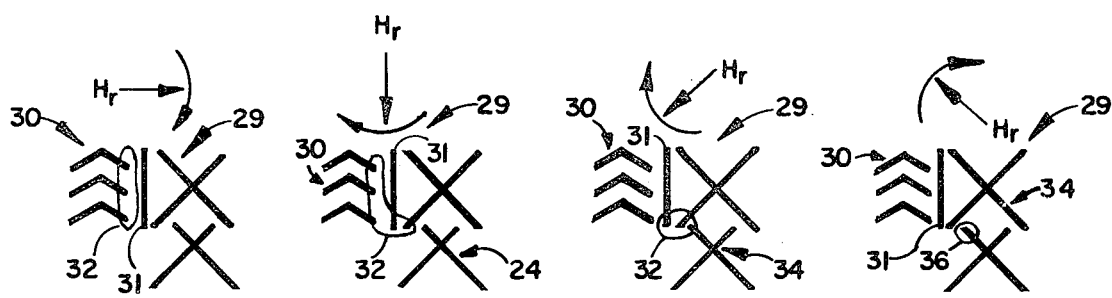

The transition structures 28, 28A, 29, and 29A each include a bar-shaped element 31. Using structures 28 and 29 as examples, consider a strip domain 32 which is located under end element 30 of chevron channel 14 and is moving under the influence of the rotating drive field, $H_r$, to the right as indicated by the arrows in FIGS. 2a and 3a. The domain 32 is elongated in the direction of movement by the bar element, as shown in FIGS. 2b and 3b. The strip domain 32 is then transferred to the bar element 31 and either an end T-X element 33 (of T-X channel 26, FIG. 1), as shown in FIG. 2c, or an end X-bar element 34 (of X-bar channel 27, FIG. 1), as shown in FIG. 3c. Referring further to FIGS. 2c and 3c, the strip domain 32 is now moving parallel to its length and is contracted along its length by the dense array of magnetic poles formed by the bar element 31 and the T-X element 33 or the X-bar element 34. Finally, the strip domain 32 is further contracted into a bubble domain 36 and is transferred completely to the T-X or the X-bar propagation channels (i.e., to end elements 33 or 34), as shown in FIGS. 2d and 3d.

Referring to FIG. 1, the converse of the above sequence applies when the bubble domain 36 is transferred by the transition structures 28A or 29A from the channels 26 or 27 to one of the chevron channels 14. Thus, the efficient connection of chevron structures, such as the chevron channels 14, to other types of structures, such as the T-X and X-bar propagation channels 26 and 27, is made possible by the use of transition structures which incorporate the bar element 31.

It should be noted that none of the figures is to scale and that the linewidths, gaps, and other dimensions of the patterns are not intended to be precisely accurate. One skilled in the art will easily determine the dimensions that are appropriate for the structures. For example, given the width, $w$, of a strip domains 32 (FIGS. 2a or 3a), the optimum dimensions for linewidth (approximately $0.6w$), for the gaps between elements ($0.5 \times$ linewidth), and for the periodicity of the chevron channel 14 (approximately $4w$) may be quickly ascertained.

Testing of a combination structure 40 which comprised chevron channels 14, transition structures 28 and 28A, and T-X channel 26 indicated a consecutive bit operating margin of approximately 14.4 Oersteds at 100 kHz for a drive field of 30 Oersteds. A structure 45 comprised of chevron channels 14, transition structures 29 and 29A, and X-bar channel 27 provided an operating margin of about 8.3 Oersteds at a drive field of 40 Oersteds. However, the tested structure 45 was very poorly formed. Since the pole configurations during transition provided by the structures 29 and 29A are substantially identical to that for structures 28 and 28A, it is to be expected that a better defined structure 45 will provide about the same operating margins as the structure 40. Thus, both structures should provide wider consecutive bit operating margins than the range of 8–10 Oersteds which is typical of the chevron to T-bar transition structure described in the aforementioned IEEE article, entitled "Magnetic Bubble Memory Chip Design". The chevron to T-bar transition structure is normally operated with alternate bits, yielding a 10–15 Oersted margin.

Because the operating margin for T-X and X-bar structures can be expected to be wider than that for T-bar structures at high frequencies, these structures may be more desirable than T-bar structures for future high speed devices. Fortunately, the use of transition bar element 31 permits both the T-X and the X-bar propagation channels to be incorporated into devices which employ chevron structures, such as the chevron propagation channels 14 and the stretcher detector 16. That is, a transition bar element 31 is positioned between and adjacent to the ends of chevron channels 14 and T-X channels 26 or X-bar channels 27, and substantially perpendicular to the direction of domain movement. Then, as discussed previously, a strip domain 31 (FIG. 2a or 3a) traveling from the chevron channel 14 to the T-X or X-bar structures 26 or 27 is elongated in the direction of propagation, then contracted into a bubble domain. Similarly, when traveling from the T-X and X-bar channels to a chevron channel, a bubble domain is elongated, then contracted into a strip domain.

The use of the bar shaped element 31, and the combination of the bar-shaped element 31 with chevron structures (such as channels 14) and other efficient structures, such as those formed from columns comprising a plurality of pairs of intersecting elements (e.g., the T-X channel 26 and the X-bar channel 27), provides transition structures having closely-spaced arrays of magnetic poles. The dense arrays of magentic poles permit the use of compact transition structures. It will be noted from reference to FIGS. 2a–d and 3a–d that a domain traverses the transition structures in less than one period of the drive field, $H_r$.

Other transition structures may be derived by those skilled in the art. In addition, transition structures within the present invention may be combined with corner structures such as those taught in the aforementioned copending application entitled "Complementary, Corner Structures for Magnetic Domain Propagation", to Peter K. George, which is hereby incorporated by reference. For example, a transition structure within the scope of the present invention may comprise a plurality of radially-positioned bar elements for transferring domains through directional changes between channels formed by a chevron structure and an adjoining, different type of structure.

Thus, there have been described transition structures utilizing high magnetic pole densities to facilitate transferring single wall magnetic domains from chevron structures to other types of structures, and vice versa. The scope of the invention is limited, however, only by the claims appended hereto and equivalents thereof.

Having thus described a preferred embodiment of the invention, what is claimed is:

1. A magnetic domain device, comprising:
    a layer of magnetic material in which single wall domains can be moved;
    a patterned arrangement of magnetically soft elements in juxtaposition to said layer and responsive to a cyclically varying magnetic field in the plane of said layer to form at least a pair of channels for moving domains, said pair of channels having adjacent end portions;
    the first of said pair of channels comprising adjacent columns of chevron-shaped elements, one column thereof defining the first of said adjacent end portions;

the second of said pair of channels comprising adjacent columns of X or T-X elements, one column thereof defining the second of said adjacent end portions; and at least one magnetically soft element interposed between said adjacent end portions of said pair of channels for transferring domains between said adjacent end portions within one period of the pattern as established by one period of said cyclically varying magnetic field.

2. A device ad defined in claim 1, wherein said first of said pair of adjacent end portions includes columns having at least three chevron-shaped elements.

3. The magnetic domain device recited in claim 1 wherein each of said magnetically soft elements is fabricated of permalloy.

4. The magnetic domain device recited in claim 1, wherein said adjacent end portions are arranged in a substantially continuous line.

5. A magnetic domain device comprising a patterned arrangement of magnetically soft elements on a layer of magnetic material which permits single wall domains to be formed and moved therein, in response to a cyclically varying magnetic field in the plane of said layer to form said patterned arrangement comprising at least first and second propagation paths for controlling motion of domains;

each of said first and second propagation paths having end portions which are adjacent to each other;

said first propagation path comprising a plurality of adjacent columns of parallel elements, one of said adjacent columns defining the end portion of said first propagation path;

said second propagation path comprising a plurality of adjacent columns of intersecting elements, said intersecting elements taken from the class including X-bar elements and T-bar elements, at least one of said intersecting elements inclined relative to the direction of propagation of single wall domains through the respective first and second propagation paths, one of said adjacent columns defining the end portion of said second propagation path; and at least one magnetically soft element interposed between the adjacent end portions of said first and second propagation paths for transferring single wall domains between said end portions within one period of said cyclically varying magnetic field.

6. The device recited in claim 5, wherein said parallel elements are chevron shaped elements.

* * * * *